United States Patent
Fan

(10) Patent No.: US 11,841,569 B2
(45) Date of Patent: Dec. 12, 2023

(54) SPLICING DISPLAY DEVICE

(71) Applicant: TCL CHINA STAR OPTOELECTRONICS TECHNOLOGY CO., LTD., Guangdong (CN)

(72) Inventor: Yongping Fan, Guangdong (CN)

(73) Assignee: TCL CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 155 days.

(21) Appl. No.: 17/597,229

(22) PCT Filed: Dec. 21, 2021

(86) PCT No.: PCT/CN2021/139939
§ 371 (c)(1),
(2) Date: Dec. 29, 2021

(87) PCT Pub. No.: WO2023/103080
PCT Pub. Date: Jun. 15, 2023

(65) Prior Publication Data
US 2023/0176411 A1  Jun. 8, 2023

(30) Foreign Application Priority Data
Dec. 6, 2021 (CN) .......................... 202111477605.6

(51) Int. Cl.
*G02F 1/1333* (2006.01)

(52) U.S. Cl.
CPC .... *G02F 1/13336* (2013.01); *G02F 1/133314* (2021.01)

(58) Field of Classification Search
None
See application file for complete search history.

(56) References Cited

U.S. PATENT DOCUMENTS

| 2017/0008695 | A1 | 1/2017 | Bleich |
| 2017/0192273 | A1* | 7/2017 | Fan ........................... G09F 9/35 |
| 2020/0064677 | A1* | 2/2020 | Yoon ...................... G09F 9/3026 |
| 2020/0066828 | A1* | 2/2020 | Meersman ........... H10K 77/111 |
| 2022/0415217 | A1* | 12/2022 | Zhang .................... H01L 33/005 |

(Continued)

FOREIGN PATENT DOCUMENTS

| CN | 103901643 A | 7/2014 |
| CN | 210535225 U | 5/2020 |

(Continued)

*Primary Examiner* — Ryan Crockett
(74) *Attorney, Agent, or Firm* — HAMRE, SCHUMANN, MUELLER & LARSON, P.C.

(57) ABSTRACT

The present application provides a splicing display device, a light-emitting diode (LED) substrate is arranged on adjacent display devices, and the LED substrate covers a gap. LED elements are arranged on a base. A first magnetic member is arranged on the base. A fastening module includes a fastening element and a magnetic assembly. The fastening element is arranged on a support module. At least a portion of the fastening element is arranged corresponding to the gap. The magnetic assembly is arranged on the fastening element and located in the gap. The magnetic assembly is magnetically connected to the first magnetic member.

20 Claims, 4 Drawing Sheets

(56) References Cited

U.S. PATENT DOCUMENTS

| | | | | |
|---|---|---|---|---|
| 2023/0204997 A1* | 6/2023 | Chen | ................ | G02F 1/1339 |
| | | | | 349/56 |
| 2023/0206787 A1* | 6/2023 | Zou | ................ | G09F 9/3026 |
| | | | | 361/679.01 |

FOREIGN PATENT DOCUMENTS

| CN | 210627782 U | | 5/2020 |
|----|-------------|---|--------|
| CN | 111276058 A | | 6/2020 |
| CN | 111312087 A | | 6/2020 |
| CN | 210720954 U | | 6/2020 |
| CN | 111653207 A | | 9/2020 |
| CN | 111883005 A | | 11/2020 |
| CN | 112309268 A | | 2/2021 |
| CN | 112863390 A | | 5/2021 |
| CN | 213990829 U | | 8/2021 |
| CN | 214042924 U | | 8/2021 |
| CN | 113703211 A | | 11/2021 |
| CN | 214669956 U | * | 11/2021 |
| CN | 214669956 U | | 11/2021 |
| JP | 2007192977 A | | 8/2007 |
| JP | 2017152553 A | | 8/2017 |

* cited by examiner

SPLICING DISPLAY DEVICE

FIELD OF DISCLOSURE

The present application relates to a field of display technology and in particular, to a splicing display device.

DESCRIPTION OF RELATED ART

With rapid development of the outdoor display market, there has been a trend to develop large-size and high-resolution outdoor displays. Conventional liquid crystal display devices have advantages such as low cost and high resolution, but when spliced to form a splicing screen, it has seams which cannot be eliminated, and consequently, visual effects are affected. Conventional technology combines mini-LED display technology and covers the seams with light-emitting diode light bars, so that liquid crystal panels can be spliced with zero seam, thereby improving splicing quality.

During research and practice in conventional techniques, the inventor of the present application found that the light-emitting diode light bars are generally fixed on the liquid crystal panels with an adhesive, which is not conducive to the installation and adjustment of the light-emitting diode light bars.

SUMMARY

The present application provides a splicing display device, which facilitates the installation and adjustment of a light-emitting diode substrate.

The present application provides a splicing display device, comprising:
- at least two display devices, wherein a plurality of gaps are defined between the at least two display devices, and each display device comprises a support module and a panel disposed on the support module;
- a plurality of light-emitting diode (LED) substrates, wherein each LED substrate is arranged on two adjacent display devices and covers one of the gaps, wherein the LED substrate comprises a base, a plurality of LED elements and a plurality of first magnetic members, the base is arranged on two adjacent panels, the LED elements are arranged on the base, and the first magnetic members are arranged on one side of the base away from the LED elements; and
- a plurality of fastening modules, wherein each fastening module comprises a fastening element and a plurality of magnetic assemblies, the fastening elements are arranged on the support modules, at least a portion of each fastening element is arranged corresponding to one of the gaps, the magnetic assemblies are arranged on the fastening elements and located in the plurality of gaps, and the magnetic assemblies are magnetically connected to the first magnetic members;
- wherein a plurality of redundant bond pads are arranged on each base, wherein the redundant bond pads are arranged on one side of each base away from the corresponding LED elements, and the first magnetic members are fixedly connected to the redundant bond pads;
- wherein each first magnetic member comprises material selected from one of a magnetic conductor material or a permanent magnetic material.

Optionally, in some embodiments, each magnetic assembly comprises a supporting base, a connecting element, and a second magnetic member, the supporting bases are arranged on the fastening elements, the connecting elements are extendably arranged on the supporting bases, and the second magnetic members are arranged on the connecting elements.

Optionally, in some embodiments, each connecting element and the corresponding second magnetic member are integrally formed, and the connecting elements are made of a magnetic material.

Optionally, in some embodiments, each supporting base is provided with a threaded hole, an outer surface of each connecting element is provided with a plurality of threads, and the connecting elements are threadedly connected to the threaded holes.

Optionally, in some embodiments, one end of each fastening element is connected to a back of one of the support modules, and another end of each fastening element is connected to a back of another support module, and each fastening element crosses the corresponding gap; and each connecting element is arranged on a portion of one of the fastening elements corresponding to one of the gaps.

Optionally, in some embodiments, each fastening element is disposed in one of the gaps, one end of each fastening element is connected to a side surface of one of the support modules, and another end of each fastening element is connected to a side surface of another support module.

Optionally, in some embodiments, each fastening element comprises a first fastening part and a second fastening part, and each connecting element comprises a first connecting part and a second connecting part, wherein between two adjacent display devices, the first fastening part is arranged on a back or a side surface of one support module, and the second fastening part is arranged on a back or a side surface of another support module, the first connecting part is arranged on the first fastening part, and the second connecting part is arranged on the second fastening part.

Optionally, in some embodiments, the support modules are backlight modules, and the panels are liquid crystal panels.

Optionally, in some embodiments, each support module comprises a backplate, the panels are non-liquid-crystal panels, the panels are arranged on the backplates, and the fastening elements are arranged on one sides of the backplates away from the panels.

Accordingly, the present application further provides a splicing display device, comprising:
- at least two display devices, wherein a plurality of gaps are defined between the at least two display devices, and each display device comprises a support module and a panel disposed on the support module;
- a plurality of light-emitting diode (LED) substrates, wherein each LED substrate is arranged on two adjacent display devices and covers one of the gaps, wherein the LED substrate comprises a base, a plurality of LED elements and a plurality of first magnetic members, the base is arranged on two adjacent panels, the LED elements are arranged on the base, and the first magnetic members are arranged on one side of the base away from the LED elements; and
- a plurality of fastening modules, wherein each fastening module comprises a fastening element and a plurality of magnetic assemblies, the fastening elements are arranged on the support modules, at least a portion of each fastening element is arranged corresponding to one of the gaps, the magnetic assemblies are arranged on the fastening elements and located in the plurality of gaps, and the magnetic assemblies are magnetically connected to the first magnetic members.

The present application uses the fastening modules and the first magnetic members arranged on the LED substrates to achieve magnetic attraction connection, which simplifies installation of the LED substrates and enhances adjustability of the LED substrates.

Optionally, in some embodiments, a plurality of redundant bond pads are arranged on each base, the redundant bond pads are arranged on one side of each base away from the corresponding LED elements, and the first magnetic members are fixedly connected to the redundant bond pads.

The first magnetic members are fixed on the redundant bond pads. On the one hand, idle bond pads are reasonably used. On the other hand, the welding method is used to achieve stable connection between the first magnetic members and the redundant bond pads.

Optionally, in some embodiments, each magnetic assembly comprises a supporting base, a connecting element, and a second magnetic member, the supporting bases are arranged on the fastening elements, the connecting elements are extendably arranged on the supporting bases, and the second magnetic members are arranged on the connecting elements.

The connecting element is extendably arranged on the supporting base, and therefore the present application can easily adjust a vertical position of the LED substrate, and improves the stability and applicability in installing the LED substrate.

Optionally, in some embodiments, each connecting element and the corresponding second magnetic member are integrally formed, and the connecting elements are made of a magnetic material.

Such configuration simplifies a structure of the magnetic assembly and improves the stability of the overall structure.

Optionally, in some embodiments, each supporting base is provided with a threaded hole, an outer surface of each connecting element is provided with a plurality of threads, and the connecting elements are threadedly connected to the threaded holes.

The connecting element is extendable by means of a threaded connection, and the threaded connection achieves precise extendable functions and a convenient telescopic extension of the connecting element.

Optionally, in some embodiments, one end of each fastening element is connected to a back of one of the support modules, and another end of each fastening element is connected to a back of another support module, and each fastening element crosses the corresponding gap; and each connecting element is arranged on a portion of one of the fastening elements corresponding to one of the gaps.

The fastening element is fixed to the backs of the support modules of two adjacent display devices, thereby improving the stability and convenience in assembling the fastening module and the display devices.

Optionally, in some embodiments, each fastening element is disposed in one of the gaps, one end of each fastening element is connected to a side surface of one of the support modules, and another end of each fastening element is connected to a side surface of another support module.

The fastening element is fixed to the side surfaces of the support modules of two adjacent display devices and is located in the gap. As a result, the present application improves the stability of an assembled structure of the fastening module and the display device and saves installation space.

Optionally, in some embodiments, each fastening element comprises a first fastening part and a second fastening part, and each connecting element comprises a first connecting part and a second connecting part, wherein between two adjacent display devices, the first fastening part is arranged on a back or a side surface of one support module, and the second fastening part is arranged on a back or a side surface of another support module, the first connecting part is arranged on the first fastening part, and the second connecting part is arranged on the second fastening part.

One fastening element is installed corresponding to one connecting element, so difficulty of maintenance is reduced.

Optionally, in some embodiments, the support modules are backlight modules, and the panels are liquid crystal panels. Through such configuration, the present application combines liquid crystal display devices and the LED substrates, thus reducing costs of the splicing display device.

Optionally, in some embodiments, each support module comprises a backplate, the panels are non-liquid-crystal panels, the panels are arranged on the backplates, and the fastening elements are arranged on one sides of the backplates away from the panels. Through such configuration, the present application combines non-liquid-crystal display devices and the LED substrates, thus improves applicability.

Optionally, in some embodiments, each first magnetic member comprises material selected from one of a magnetic conductor material or a permanent magnetic material.

The splicing display device of the present application comprises at least two display devices, a plurality of LED substrates, and a plurality of fastening modules. A plurality of gaps are defined between the at least two display devices, and each display device comprises a support module and a panel disposed on the support module. Each LED substrate is arranged on two adjacent display devices and covers one of the gaps. The LED substrate comprises a base, a plurality of LED elements and a plurality of first magnetic members, the LED elements are arranged on the base, and the first magnetic members are arranged on one side of the base away from the LED elements. Each fastening module comprises a fastening element and a plurality of magnetic assemblies, the fastening elements are arranged on the support modules, at least a portion of each fastening element is arranged corresponding to one of the gaps, the magnetic assemblies are arranged on the fastening elements and located in the plurality of gaps, and the magnetic assemblies are magnetically connected to the first magnetic members.

The present application uses the fastening modules and the first magnetic members arranged on the LED substrates to achieve magnetic attraction connection, which simplifies installation of the LED substrates and enhances adjustability of the LED substrates.

BRIEF DESCRIPTION OF DRAWINGS

In order to more clearly illustrate the embodiments of the present disclosure or related art, figures which will be described in the embodiments are briefly introduced hereinafter. It is obvious that the drawings are merely for the purposes of illustrating some embodiments of the present disclosure, and a person having ordinary skill in this field can obtain other figures according to these figures without inventive work.

DETAILED DESCRIPTION OF EMBODIMENTS

Figure 1:
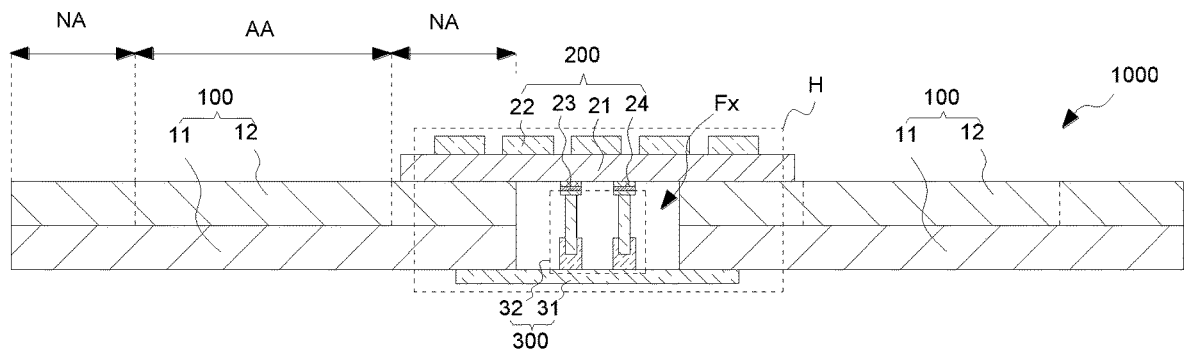
FIG. 1 is a first structural view of a splicing display device according to one embodiment of the present application.

The technical solutions in the present application will be clearly and completely described below in conjunction with accompanying drawings and with reference to specific embodiments. Obviously, the embodiments are only some of the embodiments of the present application, rather than all the embodiments. Based on the embodiments in the present application, all other embodiments obtained by those skilled in the art without creative work shall fall within the protection scope of the present application. In addition, it should be understood that the specific embodiments described here are only used to illustrate and explain the present application, and are not used to limit the present application. In the present application, unless otherwise specified, directional terms such as "upper" and "lower" generally refer to the upper and lower directions of a device in actual use or work state, and specifically refer to the directions in the drawings. The terms "inner" and "outer" are referred to with reference to outlines of the device.

The present application provides a splicing display device. Detailed descriptions are provided below. It should be noted that an order of descriptions in the following embodiments is not intended to limit a preferred order of the embodiments.

Figure 2:
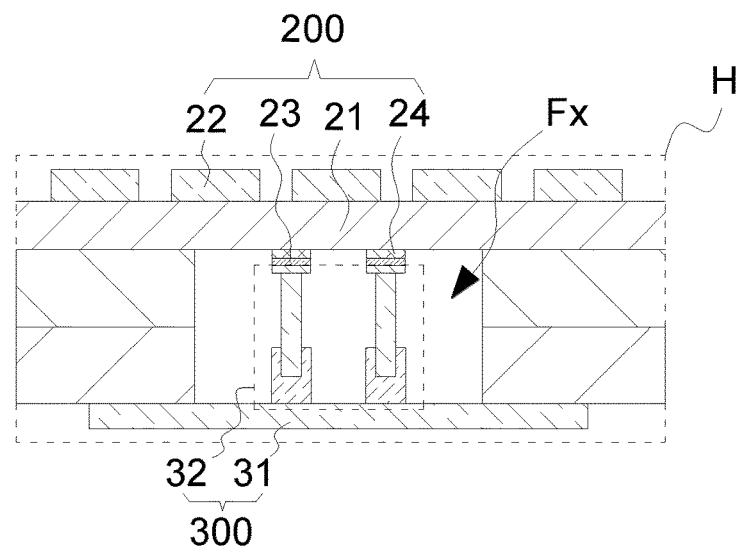
FIG. 2 is an enlarged view of part H in FIG. 1.

Referring to FIGS. 1 and 2, the present application provides a splicing display device 1000. The splicing display device 1000 comprises at least two display devices 100, a plurality of light-emitting diode (LED) substrates 200 and a plurality of fastening modules 300.

At least two display devices 100 are spliced to form a gap Fx. Each display device 100 comprises a support module 11 and a panel 12 arranged on the support module 11.

Each LED substrate 200 is arranged on two adjacent display devices 100. Each LED substrate 200 covers one of the gaps Fx. The LED substrate 200 comprises a base 21, a plurality of LED elements, and a plurality of first magnetic members 23. The base 21 is arranged on two adjacent panels 12. The LED elements 22 are arranged on the base 21, and the first magnetic members 23 are arranged on one side of the base 21 away from the LED elements 22.

Each fastening module 300 comprises a fastening element 31 and a plurality of magnetic assemblies 32. The fastening elements 31 are arranged on the support modules 11. At least a portion of each fastening element 31 is arranged corresponding to one of the gaps Fx. The magnetic assemblies are arranged on the fastening elements 31 and located in the plurality of gaps Fx. The magnetic assemblies 32 are magnetically connected to the first magnetic members 23.

The splicing display device 1000 of the present application uses the fastening modules 300 and the first magnetic members 23 arranged on the LED substrates 200 to achieve magnetic attraction connection, which simplifies installation of the LED substrates 200 and enhances adjustability of the LED substrates 200.

Optionally, in the display device 100, the support module 11 is a backlight module, and the panel 12 is a liquid crystal panel. The present embodiment combines liquid crystal display devices and the LED substrates 200, thus reducing costs of the splicing display device 1000.

Optionally, in some embodiments, each support module 11 comprises a backplate. The panels 12 are non-liquid-crystal panels, the panels 12 are arranged on the backplates, and each fastening elements 31 are arranged on one sides of the backplates away from the panels 12.

For example, the non-liquid crystal panel can be a sub-millimeter light emitting diode (Mini-LED) panel, a micro light emitting diode (Micro-LED) panel, an organic light emitting diode (OLED) panel, or a quantum dot light emitting diode (QLED) panel.

Optionally, the first magnetic member 23 comprises material selected from one of a magnetic conductor material or a permanent magnetic material. For example, the material can be iron, silicon steel, iron-aluminum alloy, permalloy, sendust alloy, spinel-type ferrites, and planar hexagonal ferrites. The material can also be magnetic steel, metal permanent magnet, magnetoplumbite type ferrites, and rare earth permanent magnet materials.

Optionally, redundant bond pads 24 are disposed on the base 21. The redundant bond pads 24 are disposed on one side of the base 21 away from the LED elements 22. The first magnetic member 23 is fixedly connected to the redundant bond pad 24.

The first magnetic members 23 are fixed on the redundant bond pads 24. On the one hand, idle bond pads are reasonably used. On the other hand, the welding method is used to achieve stable connection between the first magnetic members 23 and the redundant bond pads 24.

In some embodiments, the first magnetic member 23 can also be a coating on the redundant bond pad 24. That is to say, the first magnetic member 23 is a film layer doped with magnetic particles.

Optionally, the redundant bond pads 24 can be made of a conductive material such as metal or metal oxide. In the present embodiment, the redundant bond pads 24 can be made of metal.

Optionally, one end of the fastening element 31 is connected to the back of one support module 11, and another end of the fastening element 31 is connected to the back of another support module 11. The fastening element 31 crosses the gap Fx. The magnetic assembly 32 is disposed on a portion of the fastening element 31 corresponding to the gap Fx.

The fastening element 31 is fixed to the backs of the support modules 11 of two adjacent display devices 100, thereby improving the stability and convenience in assembling the fastening module 300 and the display devices 100.

Optionally, the panel 12 comprises a display area AA and a non-display area NA, and the non-display area NA is arranged outside the display area AA.

The LED substrate 200 is correspondingly disposed on the non-display area NA of the panel 12.

Figure 3:
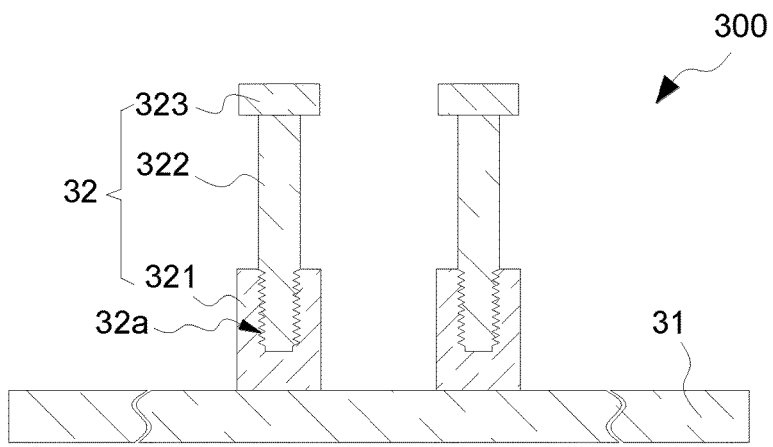
FIG. 3 is a first structural view of a fastening module of the splicing display device according to one embodiment of the present application.

Optionally, referring to FIG. 3, the magnetic assembly 32 comprises a supporting base 321, a connecting element 322 and a second magnetic member 323. The supporting base 321 is disposed on the fastening member 31. The connecting element 322 is extendably arranged on the supporting base 321. The second magnetic member 323 is disposed on the connecting element 322.

The connecting element 322 is extendably arranged on the supporting base 321, and therefore the present application can easily adjust a vertical position of the LED substrate 200, and improves the stability and applicability in installing the LED substrate 200.

Optionally, each supporting base 321 is provided with a threaded hole 32a, an outer surface of each connecting element 322 is provided with a plurality of threads, and the connecting elements 322 are threadedly connected to the threaded holes 32a.

In the present embodiment, the connecting element 322 is extendable by means of a threaded connection, and the threaded connection achieves precise extendable functions and a convenient telescopic extension of the connecting element 322.

Optionally, the first magnetic member 23 comprises material selected from one of a magnetic conductor material or a permanent magnetic material. For example, the material can be iron, silicon steel, iron-aluminum alloy, permalloy, sendust alloy, spinel-type ferrites, and planar hexagonal ferrites. The material can also be magnetic steel, metal permanent magnet, magnetoplumbite type ferrites, and rare earth permanent magnet materials.

At least one of the first magnetic member 23 or the second magnetic member 323 is a permanent magnetic member.

Figure 4:
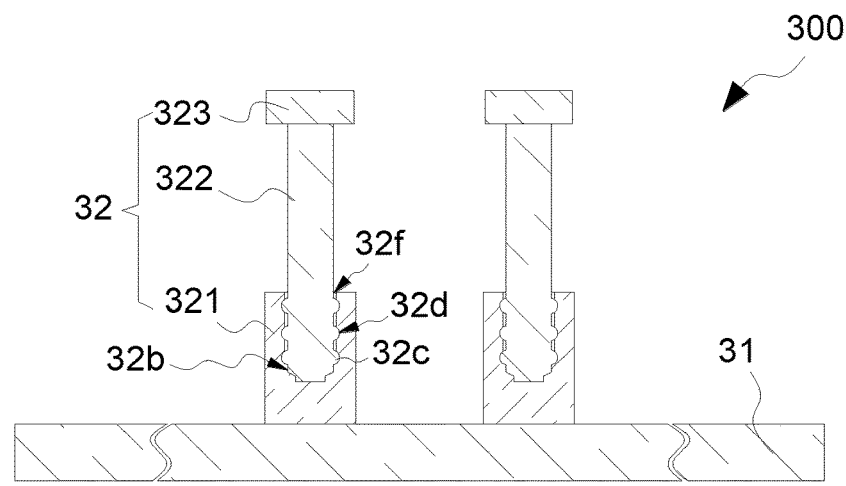
FIG. 4 is a second structural view of the fastening module of the splicing display device according to one embodiment of the present application.

Optionally, please refer to FIG. 4 for alternative embodiments. Compared with the embodiment of FIG. 3, the present embodiment can also adopt an engagement connection method to realize the telescopic extension of the connecting element 322.

In detail, the present embodiment is different from the embodiment of FIG. 3 in that, in the magnetic assembly 32, a connecting hole 32b is defined in one side of the supporting base 321 facing the LED substrate 200. An inner surface of the connecting hole 32b is provided with one of engagement blocks 32c or engagement grooves 32d arranged at intervals, and the outer surface of the connecting member 322 is provided with the other of the engagement blocks 32c or the engagement grooves 32d. The connecting element 322 is disposed in the connecting hole 32b. The engagement blocks 32c and the engagement grooves 32d are engaged with each other.

The engagement blocks 32c and the engagement grooves 32d are arranged at intervals along a telescopic direction of the connecting element 322.

The present embodiment is illustrated using an example in which the engagement grooves 32d are defined in the inner surface of the connecting hole 32b, and the connecting element 322 comprises the engagement blocks 32c; however, the present application is not limited in this regard.

Optionally, a plurality of guiding grooves 32f are defined in the magnetic assembly 32. The engagement blocks 32c can slide in the guiding grooves 32f. In the telescopic direction of the connecting element 322, the guiding grooves 32f and the engagement grooves 32d are alternately arranged and communicated with each other. A width of the guiding groove 32f is less than a width of the engagement groove 32d, and a depth of the guiding groove 32f is less than a depth of the engagement groove 32d. Such configuration facilitates movement of the connecting element 322 in the connecting hole 32b.

Figure 5:
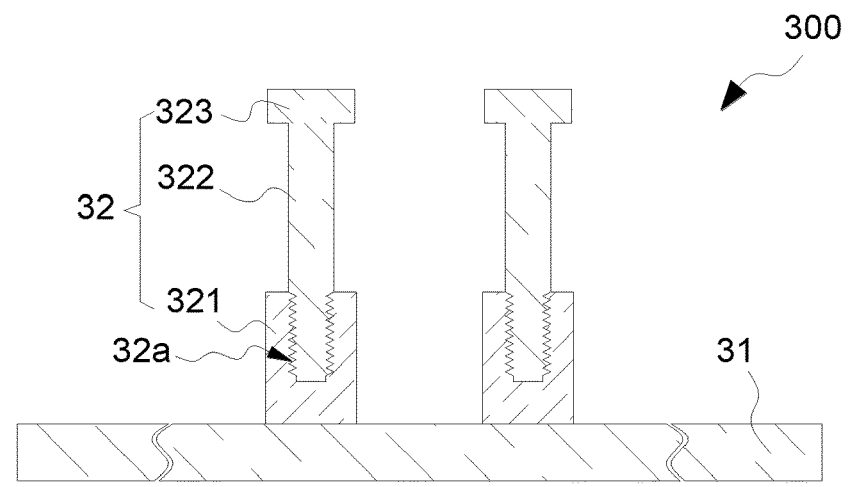
FIG. 5 is a third structural view of the fastening module of the splicing display device according to one embodiment of the present application.

Optionally, please refer to FIG. 5 for alternative embodiments. The present embodiment is different from the embodiment of FIG. 3 or FIG. 4 in that the connecting element 322 and the second magnetic member 323 are integrally formed. The connecting element 322 is a magnetic material. That is to say, the connecting element 322 and the second magnetic member 323 are made of the same material. Such configuration simplifies a structure of the magnetic assembly 32 and improves the stability of the overall structure.

It should be noted that the present embodiment is described by comparing the embodiment of 3 as an example; however, the present application is not limited in this regard.

Figure 6:
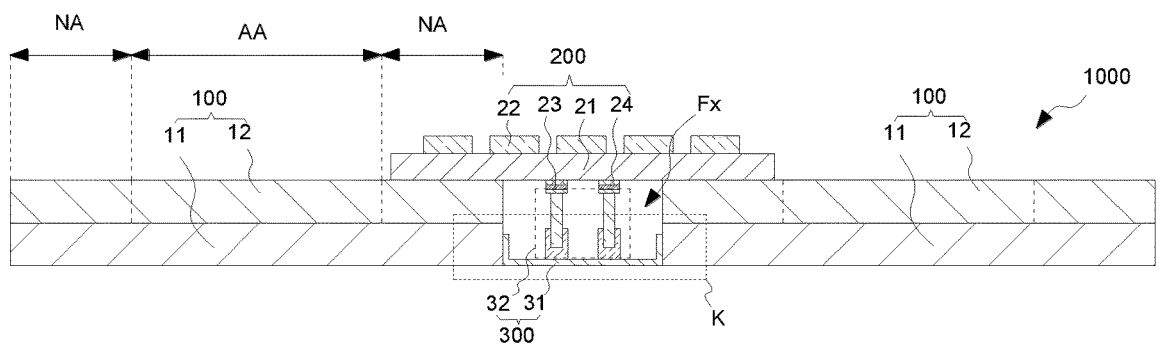
FIG. 6 is a second structural view of the splicing display device according to one embodiment of the present application.
Figure 7:
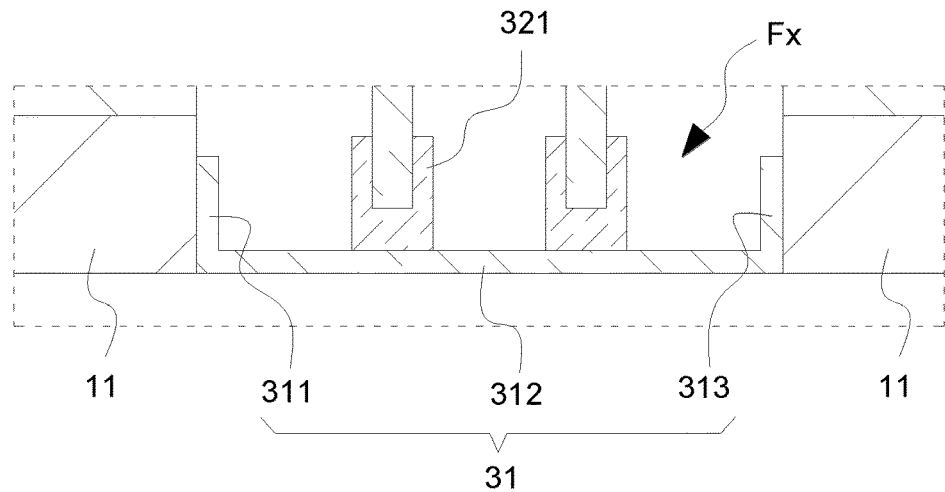
FIG. 7 is an enlarged view of part K in FIG. 6.

Optionally, please refer to FIG. 6 and FIG. 7 for alternative embodiments. Compared with the foregoing embodiments, the present embodiment is different from the foregoing embodiments in that the fastening element 31 is disposed in the gap Fx. One end of the fastening element 31 is connected to a side surface of one support module 11, and another end of the fastening element 31 is connected to a side surface of another support module 11.

The fastening element 31 is fixed to the side surfaces of the support modules 11 of two adjacent display devices 100 and is located in the gap Fx. As a result, the present application improves the stability of an assembled structure of the fastening module 300 and the display device 100 and saves installation space.

Optionally, the fastening element 31 comprises a first fastening portion 311, a middle portion 312, and a second fastening portion 313. The first fastening portion 311 is fixedly connected to the side surface of one support module 11, and the second fastening portion 313 is fixedly connected to the side surface of another support module 11. The middle portion 312 is connected between the first fastening portion 311 and the second fastening portion 313. The supporting base 321 is disposed on the middle portion 312.

Figure 8:
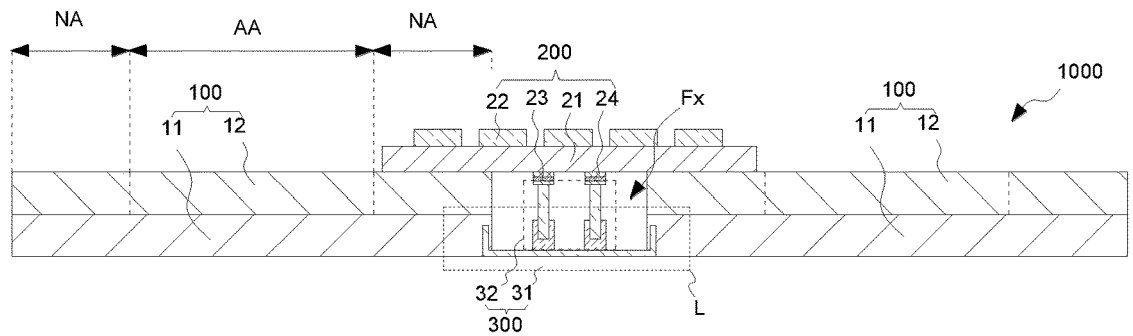
FIG. 8 is a third structural view of the splicing display device according to one embodiment of the present application.
Figure 9:
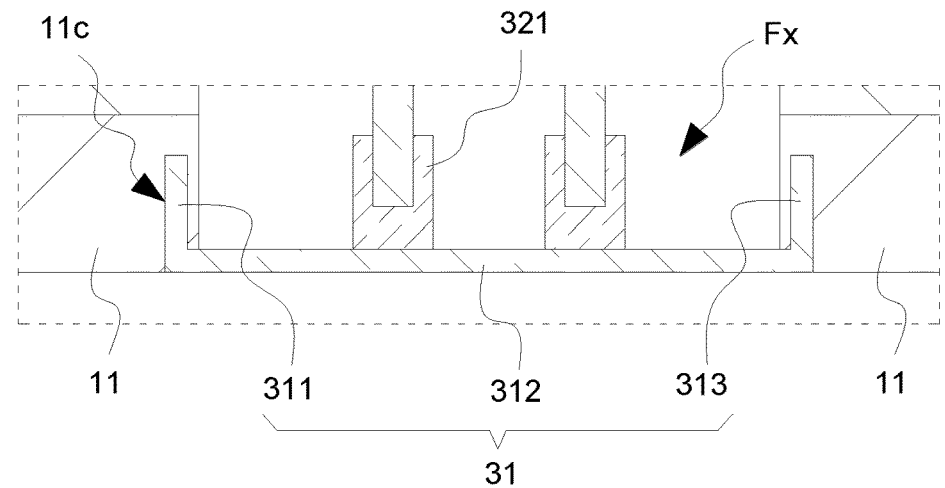
FIG. 9 is an enlarged view of part L in FIG. 6.

Optionally, please refer to FIG. 8 and FIG. 9 for alternative embodiments. The present embodiment is different from the embodiment of FIG. 6 in that, a side of each support module 11 is provided with an insertion slot 11c, the first fastening part 311 is inserted into the insertion slot 11c of one support module 11, and the second fastening part 313 is inserted into the insertion slot 11c of another support module 11. Such configuration facilitates the installation of the fastening module 300.

Figure 10:
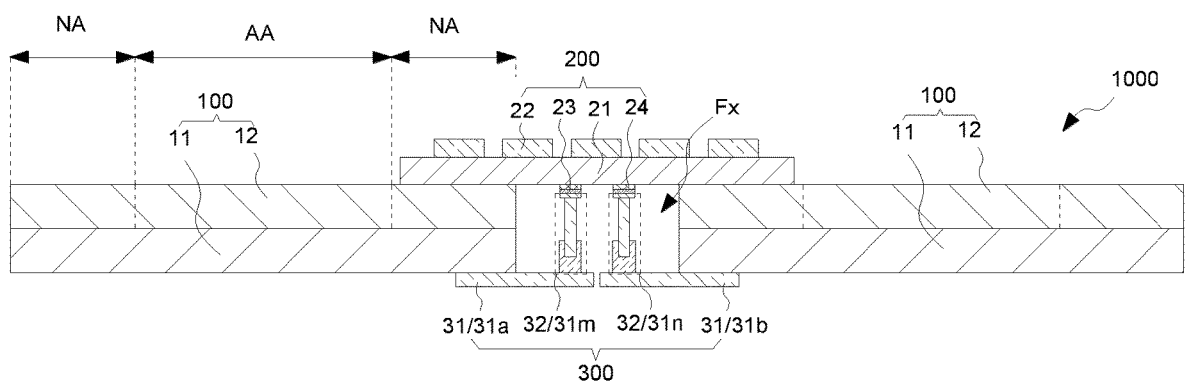
FIG. 10 is a fourth structural view of the splicing display device according to one embodiment of the present application.

Optionally, please refer to FIG. 10 for alternative embodiments. Compared with the foregoing embodiments, the fastening element 31 comprises a first fastening part 31a and a second fastening part 31b. The magnetic assemblies 32 comprise a first magnetic assembly 32m and a second magnetic assembly 32n.

Between two adjacent display devices 100, the first fastening part 31a is arranged on a back or a side surface of one support module 11, and the second fastening part 31b is arranged on a back or a side surface of another support module 11. The first magnetic assembly 32m is disposed on the first fastening part 31a. The second magnetic assembly 32n is disposed on the second fastening part 31b.

One fastening element 31 is installed corresponding to one connecting element, so difficulty of maintenance is reduced.

It should be noted that, the present embodiment is illustrated taking an example in which the first fastening part 31a and the second fastening part 31b are respectively disposed on the back surfaces of the corresponding support modules 11; however, the present application is not limited in this regard.

Optionally, there is an interval Jx between the first fastening part 31a and the second fastening part 31b. The interval is used for insertion of a flexible circuit board electrically connected to the LED substrate 200.

The splicing display device of the present application comprises at least two display devices, a plurality of LED substrates, and a plurality of fastening modules. A plurality of gaps are defined between the at least two display devices, and each display device comprises a support module and a panel disposed on the support module. Each LED substrate is arranged on two adjacent display devices and covers one of the gaps. The LED substrate comprises a base, a plurality of LED elements and a plurality of first magnetic members, the LED elements are arranged on the base, and the first magnetic members are arranged on one side of the base away from the LED elements. Each fastening module comprises a fastening element and a plurality of magnetic assemblies, the fastening elements are arranged on the support modules, at least a portion of each fastening element is arranged corresponding to one of the gaps, the magnetic assemblies are arranged on the fastening elements and located in the plurality of gaps, and the magnetic assemblies are magnetically connected to the first magnetic members.

The present application uses the fastening modules and the first magnetic members arranged on the LED substrates to achieve magnetic attraction connection, which simplifies installation of the LED substrates and enhances adjustability of the LED substrates.

The above is a detailed description to the splicing display device of the present application. Specific examples are used in the present disclosure to illustrate working principles and embodiments of the present application. The descriptions of the above embodiments are only used for ease of understanding the present application. Those skilled in the art can modify the embodiments and the application range according to the ideas of the present application. In conclusion, the contents of the specification should not be construed as a limitation to the present application.

What is claimed is:

1. A splicing display device, comprising:
   at least two display devices, wherein a plurality of gaps are defined between the at least two display devices, and each display device comprises a support module and a panel disposed on the support module;
   a plurality of light-emitting diode (LED) substrates, wherein each LED substrate is arranged on two adjacent display devices and covers one of the gaps, wherein the LED substrate comprises a base, a plurality of LED elements and a plurality of first magnetic members, the base is arranged on two adjacent panels, the LED elements are arranged on the base, and the first magnetic members are arranged on one side of the base away from the LED elements; and
   a plurality of fastening modules, wherein each fastening module comprises a fastening element and a plurality of magnetic assemblies, the fastening elements are arranged on the support modules, at least a portion of each fastening element is arranged corresponding to one of the gaps, the magnetic assemblies are arranged on the fastening elements and located in the plurality of gaps, and the magnetic assemblies are magnetically connected to the first magnetic members;
   wherein a plurality of redundant bond pads are arranged on each base, wherein the redundant bond pads are arranged on one side of each base away from the corresponding LED elements, and the first magnetic members are fixedly connected to the redundant bond pads;
   wherein each first magnetic member comprises material selected from one of a magnetic conductor material or a permanent magnetic material.

2. The splicing display device according to claim 1, wherein each magnetic assembly comprises a supporting base, a connecting element, and a second magnetic member, the supporting bases are arranged on the fastening elements, the connecting elements are extendably arranged on the supporting bases, and the second magnetic members are arranged on the connecting elements.

3. The splicing display device according to claim 2, wherein each connecting element and the corresponding second magnetic member are integrally formed, and the connecting elements are made of a magnetic material.

4. The splicing display device according to claim 2, wherein each supporting base is provided with a threaded hole, an outer surface of each connecting element is provided with a plurality of threads, and the connecting elements are threadedly connected to the threaded holes.

5. The splicing display device according to claim 2, wherein one end of each fastening element is connected to a back of one of the support modules, and another end of each fastening element is connected to a back of another support module, and each fastening element crosses the corresponding gap; and
   each connecting element is arranged on a portion of one of the fastening elements corresponding to one of the gaps.

6. The splicing display device according to claim 2, wherein each fastening element is disposed in one of the gaps, one end of each fastening element is connected to a side surface of one of the support modules, and another end of each fastening element is connected to a side surface of another support module.

7. The splicing display device according to claim 2, wherein each fastening element comprises a first fastening part and a second fastening part, and each connecting element comprises a first connecting part and a second connecting part, wherein between two adjacent display devices, the first fastening part is arranged on a back or a side surface of one support module, and the second fastening part is arranged on a back or a side surface of another support module, the first connecting part is arranged on the first fastening part, and the second connecting part is arranged on the second fastening part.

8. The splicing display device according to claim 1, wherein the support modules are backlight modules, and the panels are liquid crystal panels.

9. The splicing display device according to claim 1, wherein each support module comprises a backplate, the panels are non-liquid-crystal panels, the panels are arranged on the backplates, and the fastening elements are arranged on one sides of the backplates away from the panels.

10. A splicing display device, comprising:
    at least two display devices, wherein a plurality of gaps are defined between the at least two display devices, and each display device comprises a support module and a panel disposed on the support module;
    a plurality of light-emitting diode (LED) substrates, wherein each LED substrate is arranged on two adjacent display devices and covers one of the gaps, wherein the LED substrate comprises a base, a plurality of LED elements and a plurality of first magnetic members, the base is arranged on two adjacent panels, the LED elements are arranged on the base, and the first magnetic members are arranged on one side of the base away from the LED elements; and a plurality of fastening modules, wherein each fastening module comprises a fastening element and a plurality of magnetic assemblies, the fastening elements are arranged on the support modules, at least a portion of each fastening element is arranged corresponding to one of the gaps, the magnetic assemblies are arranged on the fastening elements and located in the plurality of gaps, and the magnetic assemblies are magnetically connected to the first magnetic members.

11. The splicing display device according to claim 10, wherein a plurality of redundant bond pads are arranged on each base, the redundant bond pads are arranged on one side of each base away from the corresponding LED elements, and the first magnetic members are fixedly connected to the redundant bond pads.

12. The splicing display device according to claim 10, wherein each magnetic assembly comprises a supporting base, a connecting element, and a second magnetic member, the supporting bases are arranged on the fastening elements, the connecting elements are extendably arranged on the supporting bases, and the second magnetic members are arranged on the connecting elements.

13. The splicing display device according to claim 12, wherein each connecting element and the corresponding second magnetic member are integrally formed, and the connecting elements are made of a magnetic material.

14. The splicing display device according to claim 13, wherein each supporting base is provided with a threaded hole, an outer surface of each connecting element is provided with a plurality of threads, and the connecting elements are threadedly connected to the threaded holes.

15. The splicing display device according to claim 12, wherein one end of each fastening element is connected to a back of one of the support modules, and another end of each fastening element is connected to a back of another support module, and each fastening element crosses the corresponding gap; and each connecting element is arranged on a portion of one of the fastening elements corresponding to one of the gaps.

16. The splicing display device according to claim 12, wherein each fastening element is disposed in one of the gaps, one end of each fastening element is connected to a side surface of one of the support modules, and another end of each fastening element is connected to a side surface of another support module.

17. The splicing display device according to claim 12, wherein each fastening element comprises a first fastening part and a second fastening part, and each connecting element comprises a first connecting part and a second connecting part, wherein between two adjacent display devices, the first fastening part is arranged on a back or a side surface of one support module, and the second fastening part is arranged on a back or a side surface of another support module, the first connecting part is arranged on the first fastening part, and the second connecting part is arranged on the second fastening part.

18. The splicing display device according to claim 10, wherein the support modules are backlight modules, and the panels are liquid crystal panels.

19. The splicing display device according to claim 10, wherein each support module comprises a backplate, the panels are non-liquid-crystal panels, the panels are arranged on the backplates, and the fastening elements are arranged on one sides of the backplates away from the panels.

20. The splicing display device according to claim 10, wherein each first magnetic member comprises material selected from one of a magnetic conductor material or a permanent magnetic material.

\* \* \* \* \*